(12) United States Patent
Deak (10) Patent No.: US 6,885,576 B2
(45) Date of Patent: Apr. 26, 2005

(54) CLOSED FLUX MAGNETIC MEMORY

(75) Inventor: James G. Deak, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 298 days.

(21) Appl. No.: 10/217,600

(22) Filed: Aug. 13, 2002

(65) Prior Publication Data

US 2004/0032765 A1 Feb. 19, 2004

(51) Int. Cl.[7] .............................................. G11C 11/00
(52) U.S. Cl. ...................... 365/158; 365/117; 365/132; 365/65; 365/66; 365/173
(58) Field of Search ................................. 365/185, 117, 365/132, 65, 66, 173, 158

(56) References Cited

U.S. PATENT DOCUMENTS

| | | | |
|---|---|---|---|
| 4,887,236 A | | 12/1989 | Schloemann |
| 5,025,416 A | | 6/1991 | Prinz |
| 5,140,549 A | | 8/1992 | Fryer |
| 5,541,868 A | * | 7/1996 | Prinz ........................... 365/98 |
| 5,587,943 A | | 12/1996 | Torok et al. |
| 5,966,323 A | | 10/1999 | Chen et al. |
| 6,028,786 A | * | 2/2000 | Nishimura ................... 365/173 |
| 6,266,289 B1 | | 7/2001 | Dubovik et al. |
| 6,269,018 B1 | | 7/2001 | Monsma et al. |
| 6,538,920 B2 | | 3/2003 | Sharma et al. |
| 6,567,299 B2 | | 5/2003 | Kunikiyo et al. |
| 6,594,175 B2 | | 7/2003 | Torok et al. |
| 6,757,192 B2 | * | 6/2004 | Mukasa et al. ............. 365/173 |
| 6,768,152 B2 | * | 7/2004 | Higo .......................... 257/295 |
| 2003/0117840 A1 | | 6/2003 | Sharma et al. |
| 2003/0123283 A1 | | 7/2003 | Amano et al. |
| 2003/0189842 A1 | | 10/2003 | Deak |

OTHER PUBLICATIONS

W. D. Doyle, et al., "Electrodeposited Cylindrical Magnetic Films," *J. Appl. Phys.*, 40, 1172–1181, Mar. 1969.
J. Deak et al. "A low–noise single–domain fluxgate sensor," *Appl. Phys. Lett.* 69(8), 1157–1159, Aug. 1996.

* cited by examiner

*Primary Examiner*—Connie C. Yoha
(74) *Attorney, Agent, or Firm*—Leffert Jay & Polglaze, P.A.

(57) ABSTRACT

A closed flux magnetic memory cell has a ferromagnetic pinned structure and a ferromagnetic free structure. Data is stored by controlling the relative magnetization between the pinned and free structures. The free structure is formed as a horizontally extending toroid, or tube, that is insulated from the pinned structure. A first conductive line passes through the center of the free structure while a second conductive line is connected to the pinned structure. A third conductive line can be formed through the free structure. This line is insulated from the toroid and the first conductor. The third conductive line can also be located outside the free structure. In operation of one embodiment, the first and third conductive lines are used to control the magnetized direction of the free structure. A resistance between the first and second conductive lines defines the data stored in the memory cell.

28 Claims, 8 Drawing Sheets

CLOSED FLUX MAGNETIC MEMORY

FIELD OF THE INVENTION

The present invention relates generally to magnetic based memory devices, and in particular, the present invention relates to magnetic random access memory (MRAM).

BACKGROUND OF THE INVENTION

Memory devices can be designed and manufactured using numerous, different materials and storage techniques. For example, volatile dynamic memory devices are typically fabricated using storage capacitors. Data is stored by changing the capacitor charge, and data is retrieved by sensing the stored charge. Volatile static memory devices are designed using latch circuits to store data. Non-volatile memory devices, such as flash, use floating gate transistors to store data. Each of the current memory devices suffers from any one or more of the following: high manufacturing costs, high power consumption, operating speed deficiencies, or scalability. As such, different memory designs are being considered to address some of these problems. One type of alternate memory is based on magnetic storage techniques.

Toroidal core memory arrays can be used to store data, however, sensing the sign of the stored bit is destructive. In addition, high density memory devices cannot be fabricated due to the size of the ferromagnetic cores and the sense voltage becomes too small to detect as the device is miniaturized. Similarly, a plated wire memory cannot achieve high density, due to the method of fabricating the wires and decreasing sense voltages as the device is miniaturized.

Prior magnetic random access memories (MRAM) use an open magnetic structure for the sense layer. The open magnet structure, however, causes problems with write margin as the bit size is decreased.

U.S. Pat. No. 5,587,943 "Nonvolatile magnetoresistive memory with fully closed flux structure", issued Dec. 24, 1996, and describes a memory cell, including a storage element having a first structure with a plurality of layers. Selected layers have magnetization vectors associated therewith. The first structure exhibits giant magnetoresistance (GMR), wherein the storage element has a 'closed' flux structure in at least one dimension, and wherein the magnetization vectors are confined to the at least one dimension during all stages of operation of the storage element. The memory cell includes a means for reading information from and writing information to the first structure and a selection conductor for applying one or more selection signals to the storage element to enable reading from and writing to the first structure. Thus, GMR is used to detect the sign of the bit. The GMR sensor interrupts the closed flux structure or the closed flux structure is entirely made up of GMR materials.

U.S. Pat. No. 5,025,416 "Thin film magnetic memory elements", issued Jun. 18, 1991, and describes closed flux structures that are parallel to the wafer. A magnetic memory element is fabricated from a thin magnetic film wherein the magnetic film is grown on a lattice-matched substrate and subsequently patterned to form a closure domain. The closure domain is comprised of a plurality of legs that are joined at domain walls. The individual legs are patterned in the thin magnetic film to lie parallel to an easy axis of the thin film crystal structure being used. Thus, each closure domain represents a magnetic memory element.

For the reasons stated above, and for other reasons stated below which will become apparent to those skilled in the art upon reading and understanding the present specification, there is a need in the art for an MRAM that has a closed flux structure that can be scaled to increase memory density.

SUMMARY OF THE INVENTION

The above-mentioned problems with MRAM and other problems are addressed by the present invention and will be understood by reading and studying the following specification.

In one embodiment, data is stored in a closed magnetic structure and sensing is accomplished using a magnetic tunnel junction. The closed magnetic structure reduces cell-to-cell interactions, and requires smaller write currents than comparably sized flat film MRAM. Using a tunnel junction to sense the direction of magnetization in the ferromagnetic toroid (tube) allows this memory to be made at a much higher density than discrete toroid or wire memories. Isolating the bits also helps address the domain wall creep problem associated with plated wire memories.

In one embodiment, a memory cell comprises a ferromagnetic pinned structure, a ferromagnetic free structure insulated from the pinned structure, wherein the free structure has a tube-shape, a first conductor electrically coupled to the pinned structure, and a second conductor passing through the free structure and electrically coupled to the free structure.

In another embodiment, a closed flux memory cell comprises a horizontally extending ferromagnetic hard layer, and a horizontally extending tube-shaped ferromagnetic structure. The tube-shaped ferromagnetic structure is located adjacent to the ferromagnetic hard layer with an insulating layer therebetween. A conductive sense line is electrically coupled to the ferromagnetic hard layer, and a conductive write line is electrically coupled to the tube-shaped ferromagnetic structure and located inside the tube-shaped ferromagnetic structure. A conductive half-select line is located inside the tube-shaped ferromagnetic structure and electrically insulated from the write line and the tube-shaped ferromagnetic structure.

A ferromagnetic memory cell comprises a ferromagnetic toroid having an axis extending in a horizontal direction, and a ferromagnetic layer insulated from the ferromagnetic toroid. Data is stored by controlling a relative magnetization between the ferromagnetic toroid and the ferromagnetic layer.

A method of storing data in a ferromagnetic memory cell comprises establishing a relative magnetization between first and second ferromagnetic structures, wherein the first ferromagnetic structure is a toroid and its magnetization is established by controlling a sum current through first and second conductors. At least the first conductor passes through the toroid.

DETAILED DESCRIPTION OF THE DRAWINGS

In the following detailed description of the preferred embodiments, reference is made to the accompanying drawings, which form a part hereof, and in which is shown by way of illustration specific preferred embodiments in which the inventions may be practiced. These embodiments are described in sufficient detail to enable those skilled in the art to practice the invention, and it is to be understood that other embodiments may be utilized and that logical, mechanical and electrical changes may be made without departing from the spirit and scope of the present invention. The following detailed description is, therefore, not to be taken in a limiting sense, and the scope of the present invention is defined only by the claims.

Figure 1A:
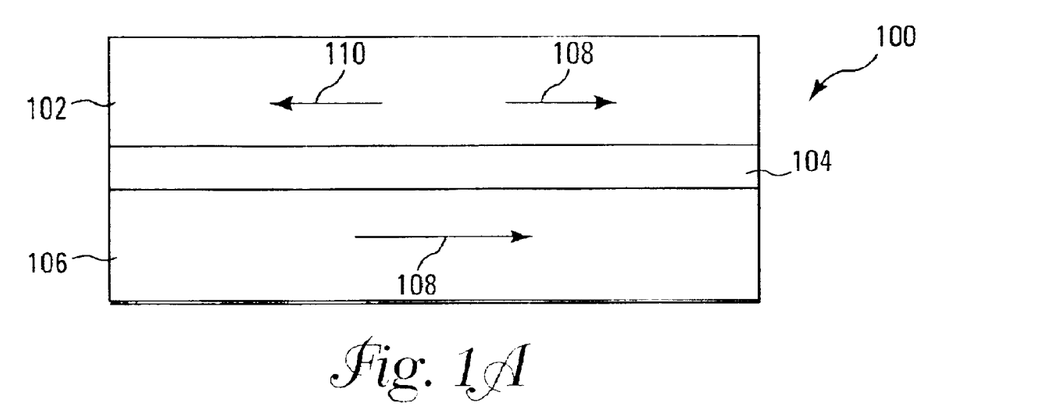
FIGS. 1A–1C illustrate a basic magnetic memory cell.
Figure 1B:
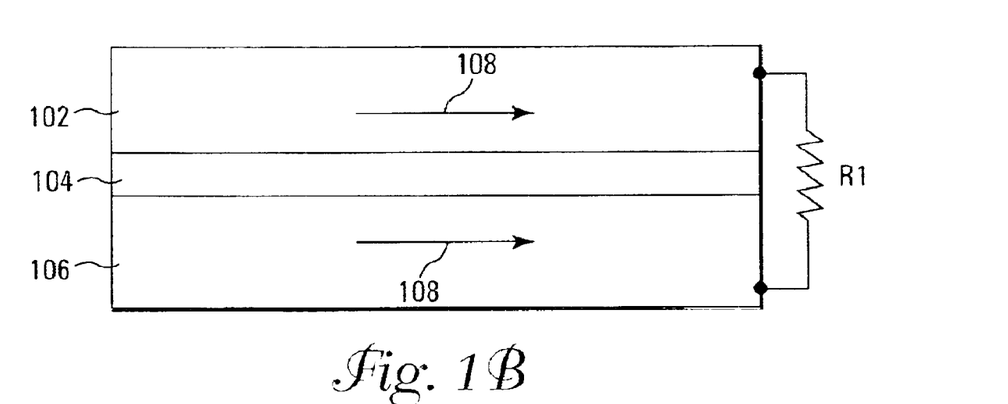
Figure 1C:
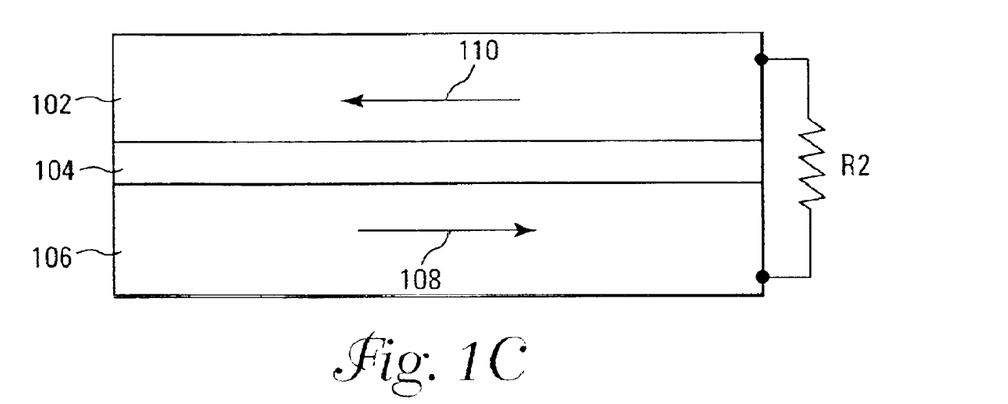

Referring to FIGS. 1A–1C, a basic description of a magnetic memory cell 100 is described. In general, the memory cell includes a pinned ferromagnetic layer 106, an isolation layer 104 and a free ferromagnetic layer 102, FIG. 1A. The pinned layer is magnetized in one horizontal direction 108, and the free layer can be magnetized in either horizontal direction 108 or 110. As seen in FIG. 1B, the free layer can be magnetized in a common direction 108 with the pinned layer. In this state, a measured resistance R1 across the cell is low. When the free layer is magnetized in an opposite direction 110 to the pinned layer, FIG. 1C, the measured resistance R2 across the cell is higher. As such, the memory cell can be used to store and read different data states. A major problem in implementing magnetic based cells is interference between adjacent cells. As such, reducing cell size and spacing to increase memory density is difficult without addressing magnetic cross-talk.

One of the most difficult problems in producing viable high-density Magnetic Random Access Memory (MRAM) is producing memory elements with reproducible write characteristics. The write problem is related to demagnetizing fields of the flat ferromagnetic layers typically used in MRAM applications. This problem is addressed in embodiments of the present invention by providing a sense layer in each MRAM bit that is a closed magnetic structure, such as a toroid or tube.

Figure 2:
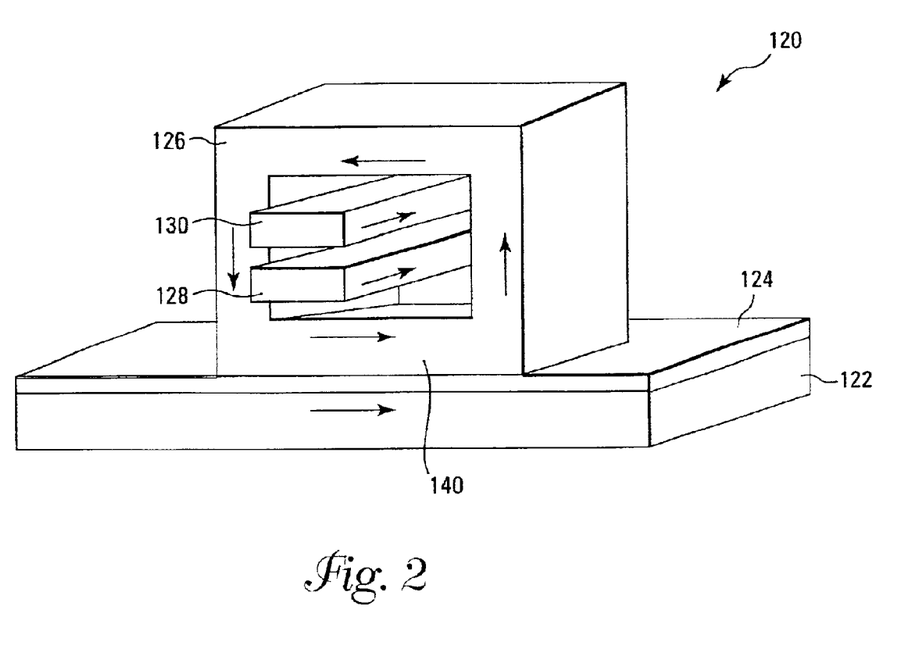
FIG. 2 illustrates the basic construction of an MRAM cell of one embodiment of the present.

Referring to FIG. 2, the basic construction and operation of an MRAM cell 120 of one embodiment of the present invention is described. The memory cell includes a ferromagnetic pinned layer 122 that is magnetized in one direction, as described above, and an insulation layer 124. A free toroid or tube-shaped ferromagnetic structure 126 is located above, and isolated from, the pinned layer. The present invention is not limited to square or round tubes, and the term tube-shaped is intended to describe any elongated structure through which a conductor can be fabricated.

The pinned, or hard, layer is programmed in a first horizontal direction. A bottom side of the toroid 140 is parallel to the pinned layer and can be magnetized in either the clockwise or counter-clockwise direction (circumferential) as illustrated. The free layer is programmed by providing currents through both a write conductor 128 and a half select conductor 130 which both pass through a center of the toroid. That is, the sum of the currents (same direction) through the two conductors result in either the clockwise or counter-clockwise magnetization of free structure 126. The benefit of using two conductors will be explained below. To read the memory cell, a resistance between the write conductor 128 (electrically coupled to free structure 126) and the pinned layer 122 is measured. Plan view and cross-sections are illustrated and described below for different embodiments of the present invention.

Figure 3A:
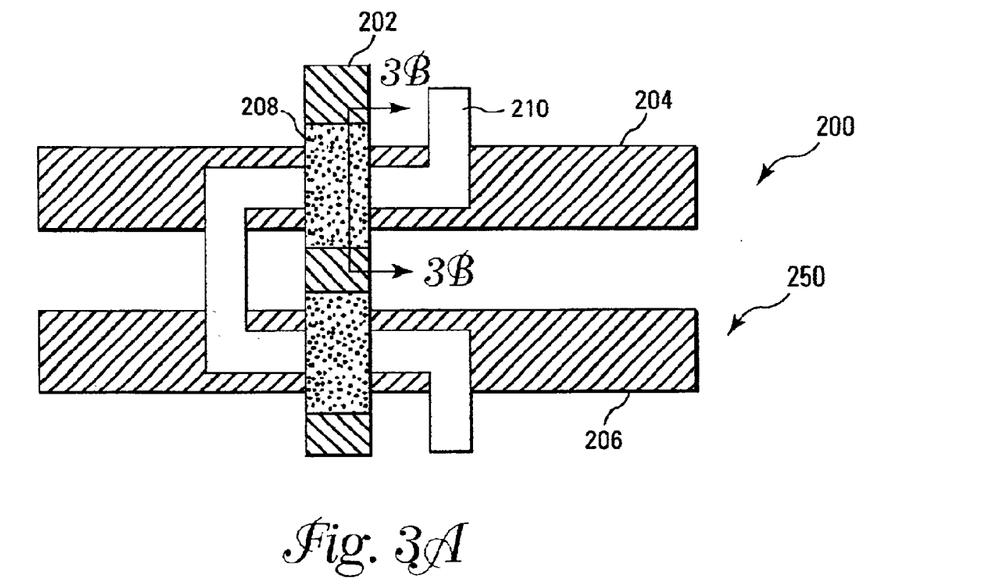
FIG. 3A illustrates a plan view of two MRAM cells.

FIG. 3A illustrates a plan view of two MRAM cells 200 and 250 (not to scale). The memory cells are arranged in a basic grid pattern with rows and columns used to read and write data to the cells. In one direction is a cell sense line 202 that is parallel (row) to the fixed layer of the cells. Write lines 204 and 206 are located perpendicular (column) to the sense line 202 and pass through the center of the free toroid portion 208 of the cell. A half-select line 210 runs generally parallel to the sense line, but passes through the cells with the write lines 204 and 206. As such, the half-select lines form a "zigzag" pattern. During operation, the sense and write lines are used to read the memory cells, and the combination of the write and half-select line are used to write the memory cells.

Figure 3B:
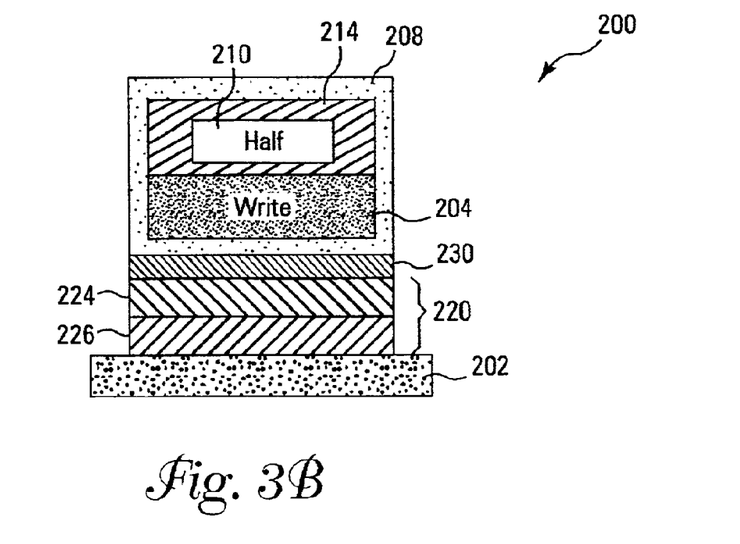
FIG. 3B is a cross-section of one of the MRAM cells of FIG. 3A.

FIG. 3B is the cross-section of one of MRAM cell 200 of FIG. 3A, as indicated by section line 3B—3B. The memory cell includes a base layer 202, which forms the sense line. Above the sense line is a hard layer 220. In one embodiment, the hard layer is a stack of an anti-ferromagnetic material 226, such as IrMn, and a ferromagnetic material 224, such as NiFe. The ferromagnet in the hard layer has a magnetization that is fixed in a particular direction by an interaction (exchange) at the interface between the anti-ferromagnet and the ferromagnet. The direction of the magnetization in the hard layer is used as a reference.

The hard layer forms one side of a tunnel junction FM/I/FM stack (ferromagnet/insulator/ferromagnet). Located above the hard layer is a tunneling barrier 230. The tunneling barrier is an insulating or semi-conducting material. In one embodiment the insulator is AlOx (alumina). The top ferromagnet layer is the free layer 208. The free layer can be selectively magnetized in two opposite directions that are parallel and anti-parallel to the direction of the magnetization in the hard layer. In one embodiment, the free layer is NiFe.

The hard layer 220, tunneling barrier 230 and free layer 208 form the tunnel junction. Note again that the hard, or pinned layer contains a FM layer 224 that has a magnetization that is fixed in one direction. The portion of the free layer adjacent to the tunneling barrier may be magnetized either parallel or anti-parallel to the pinned layer. When the portion of the free layer adjacent to 230 and the pinned layer are magnetized parallel to each other, the resistance measured between the free layer 208 and the pinned layer 220 is a minimum. When the portion of the free layer adjacent to 230 and the pinned layer are magnetized anti-parallel to each other, the resistance measured between the free layer and the pinned layer is a maximum. Thus the orientation of the magnetization of the free layer relative to the hard (or reference layer or pinned layer) can be used to represent a bit of data. The value of the bit (1 or 0) would correspond to a low or high resistance measured across the junction.

The ferromagnetic material in the fixed and free layers need not be the same, and it is also possible that one or both of the ferromagnetic layers can be multilayers. This allows for the addition of (but not limited to) synthetic ferromagnets and the use of dusting layers. In the above-described embodiment, the bottom layer 202 is not necessarily on the wafer side of the structure. It is also possible to build this structure with the free layer closest to a wafer. That is, the present invention is not limited to the vertical orientation used to describe the cell.

The free layer 208 surrounds two conductors, the half-select 210 and write lines 204. The half-select line is insulated from the free layer by an insulating material 214, such as AlOx. The write line, in contrast, is electrically connected to the free layer 208. The sense conductor 202 is electrically connected to the hard layer 220. The resistance of the junction (and thus the value of the data stored in the device) is read by measuring the resistance between the two lines electrically connected to the free and hard layers.

There are several possible schemes for writing data to the bit. These may involve either one of the lines passing through the free layer and the hard layer line, all three lines, or just the lines inside the free layer. It is advantageous to keep the maximum voltage produced across the tunneling barrier 230 to less than 1 volt when writing data to the bit. This can be accomplished using the insulated line (half-select 210) in the free layer and the line (sense 202) under the pinned layer if the insulating material in the free layer is thick, or it can be accomplished using only the lines passing through the free layer if the pinned layer line is floating. This allows the generation of large currents in the write lines without destroying the tunneling barrier.

Figure 4A:
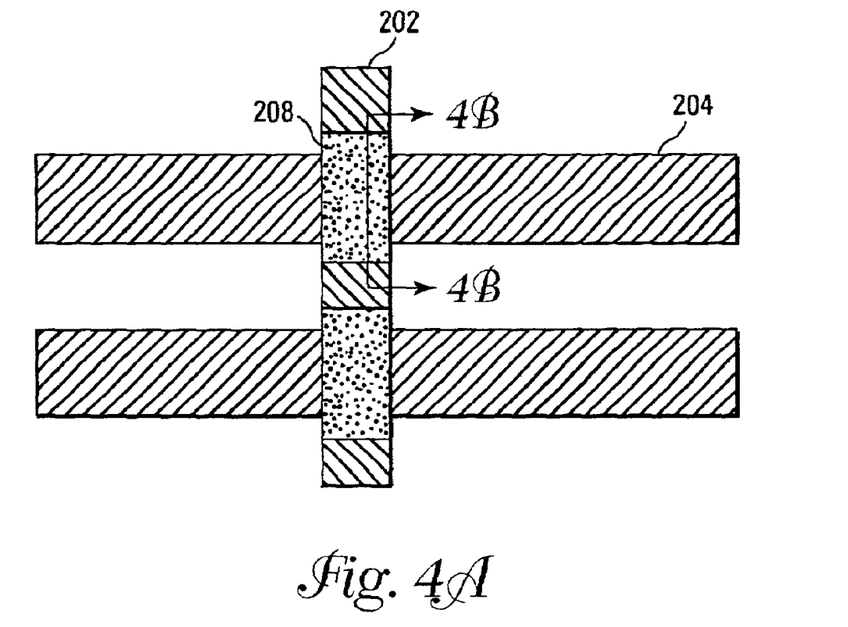
FIG. 4A illustrates a plan view of an alternate embodiment of a memory cell.
Figure 4B:
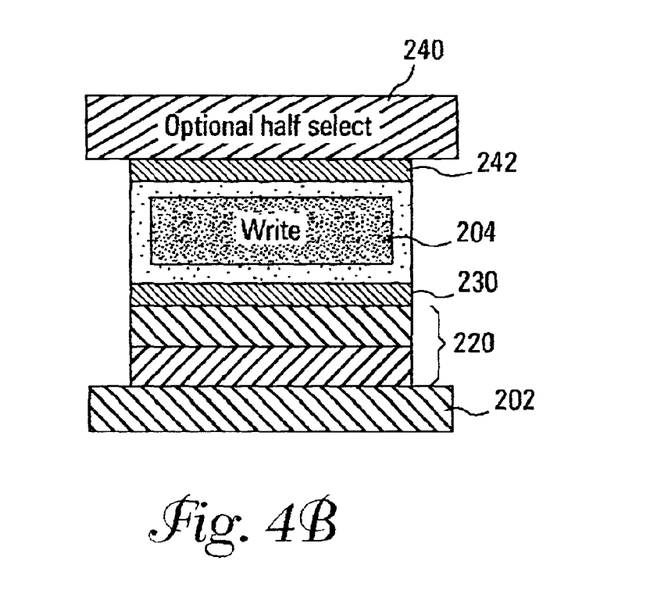
FIG. 4B is a cross-section of the memory cell of FIG. 4A.

An alternate embodiment of a memory cell 260 is described with reference to FIGS. 4A and 4B. The half-select line is not located within the free layer. As such, this embodiment does not require the insulator within the ferromagnetic toroid. The half-select line can be incorporated with the sense layer, or optionally located on an opposite side of the free layer from the hard layer 240 and separated by insulator 242. In operation, current applied to the sense line 202 (and possibly to the optional half-select line 240 on top of the toroid) tilts the magnetization of the toroid slightly out of the circumferential direction, so that a particular value of the current in the write line 204 can reverse the magnetization in the closed free layer. The optional half-select line 240 is not illustrated in FIG. 4A.

Figure 5:
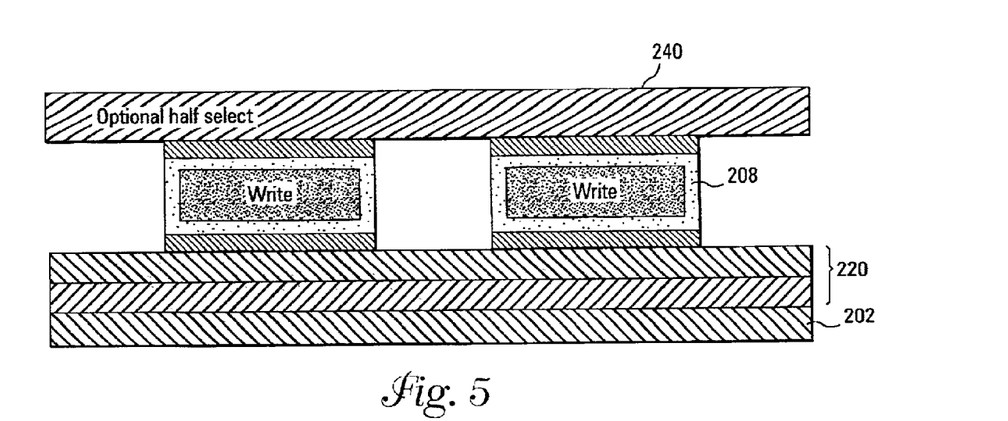
FIG. 5 illustrates an alternate embodiment of a memory cell with an extended hard layer.
Figure 6:
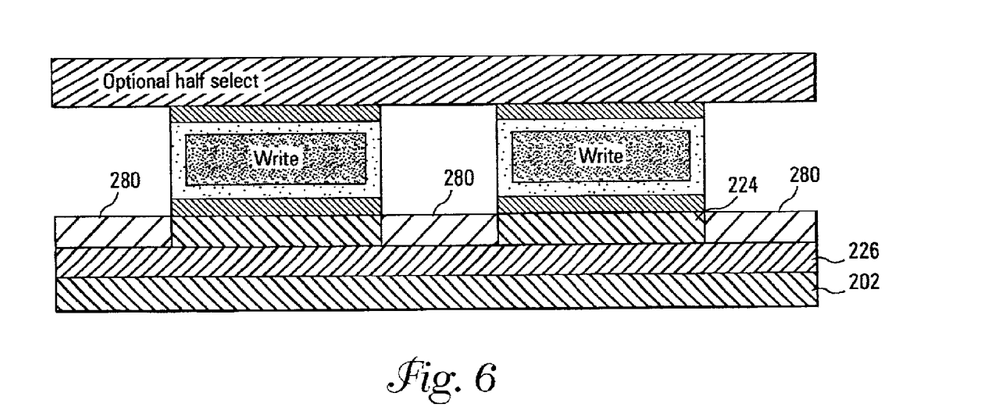
FIGS. 6 and 7 illustrate alternate embodiments of memory cells with hard bias magnets.
Figure 7:
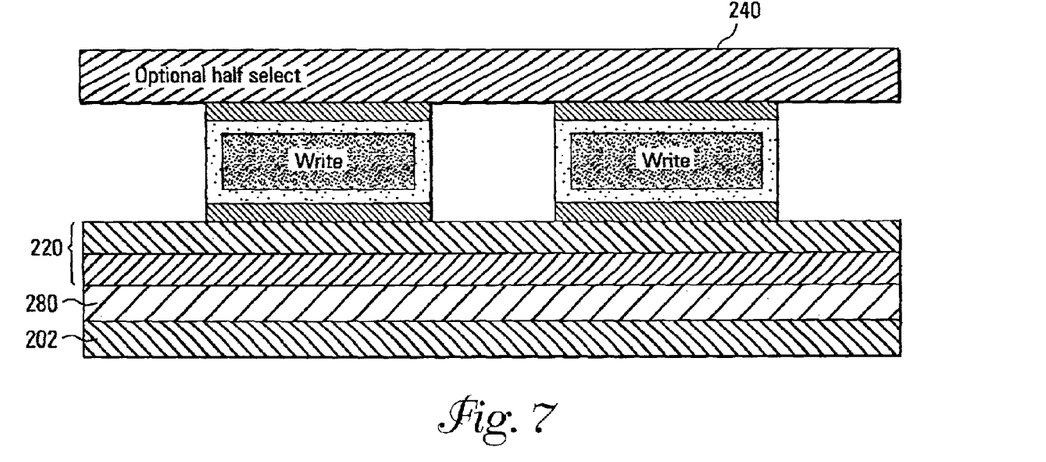

Additionally, the hard layer 220 may be extended to completely cover the entire sense line 202 in the regions between adjacent memory elements. This embodiment is illustrated in FIG. 5. In another embodiment, hard bias magnets 280 could be used between adjacent memory elements in order to better stabilize the pinned layer, see FIG. 6. The hard bias magnets can be initialized in a magnetic field at some point during the assembly/fabrication process. In another embodiment, hard bias magnet 280 can be located under the memory elements in order to better stabilize the pinned layer 220, see FIG. 7.

Figure 8:
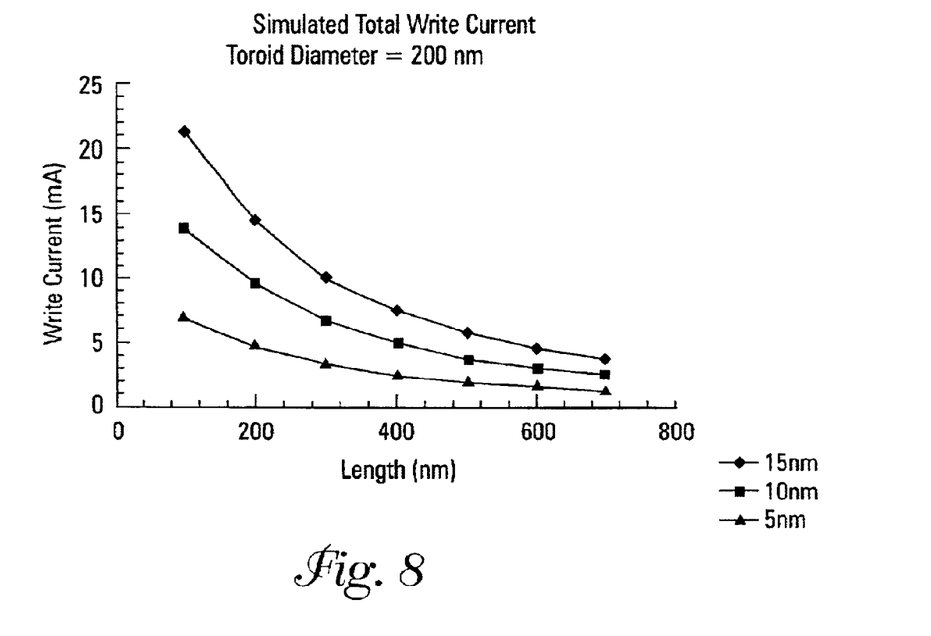
FIG. 8 illustrates a calculated total write current through the center of a memory cell.

FIG. 8 illustrates a calculated total write current through the center of a toroid required to switch the direction of the magnetization if the bit has an outer diameter of 200 nm. Each curve in the plot is for a different toroid thickness (5, 10, 15 nm). Note that the total write current decreases with increasing length and decreasing thickness. In one embodiment, the ferromagnetic free structure has a length up to 1000 nm, an outer diameter of up to 400 nm, and a thickness of up to 40 nm.

Figure 9:
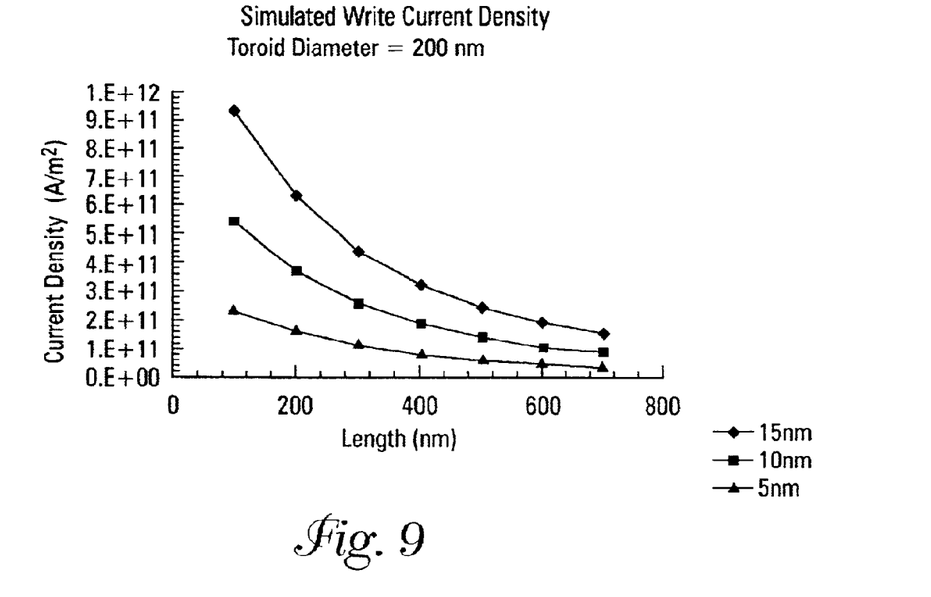
FIG. 9 illustrates a simulated write current density for the same memory dimensions of FIG. 8.

FIG. 9 illustrates a simulated write current density for the same toroid dimensions used in the write current calculations of FIG. 8. For good reliability, it is probably necessary to keep the current density below $2e^{11}$ A/m$^2$. In contrast to MRAM's use of flat open magnetic bits, the dimensions of the toroidal bit can be adjusted to keep the current density in this range.

Figure 10:
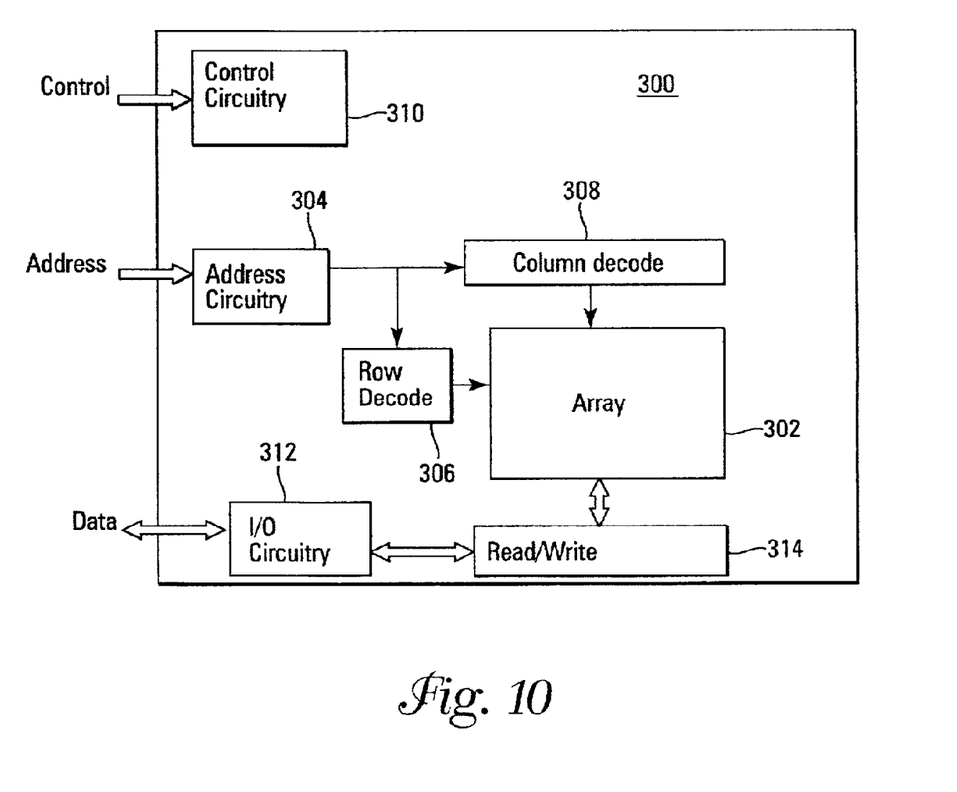
FIG. 10 is a block diagram of a memory device of an embodiment of the present invention.

A block diagram of a memory device 300 of the present invention is illustrated in FIG. 10. The memory device includes an array of memory cells 302 that are fabricated according to the closed flux structures described above. Address circuitry 304 is provided to access the memory cells using row 306 and column 308 decoders to analyze externally provided address signals. A control circuit 310 is provided to perform read and write operations in response to externally provided control signals. Bi-directional data communication with the memory array is performed by I/O circuitry 312 and read/write circuitry 314. It will be appreciated by those skilled in the art, with the benefit of the present description, that the memory device has been simplified and that additional circuitry and features may be required.

CONCLUSION

A closed flux magnetic memory cell has been described. The memory cell has a ferromagnetic pinned structure and a ferromagnetic free structure. Data is stored by controlling the relative magnetization between the pinned and free structures. The free structure is formed as a horizontally extending toroid, or tube-shape, that is insulated from the pinned structure. A first conductive line passes through the center of the free structure while a second conductor is connected to the pinned structure. A third conductive line can be formed through the free structure. The third line is insulated from the toroid and the first conductor. The third conductive line can also be located outside the free structure. In operation of one embodiment, the first and third conductive lines are used to control the magnetized direction of the free structure. A resistance between the first and second conductive lines defines the data stored in the memory cell.

Although specific embodiments have been illustrated and described herein, it will be appreciated by those of ordinary skill in the art that any arrangement, which is calculated to achieve the same purpose, may be substituted for the specific embodiment shown. This application is intended to cover any adaptations or variations of the present invention. Therefore, it is manifestly intended that this invention be limited only by the claims and the equivalents thereof.

What is claimed is:

1. A memory cell comprising:
    a ferromagnetic pinned structure;
    a ferromagnetic free structure insulated from the pinned structure, wherein the free structure has a tube-shape;
    a first conductor electrically coupled to the pinned structure; and
    a second conductor passing through the free structure and electrically coupled to the free structure.

2. The memory cell of claim 1 further comprising a third conductor passing through the free structure and electrically insulated from the free structure and the first conductor.

3. The memory cell of claim 1 further comprising a third conductor located adjacent to the free structure and electrically insulated from the free structure and the first conductor.

4. The memory cell of claim 1 wherein the pinned structure comprises a stack of an anti-ferromagnetic material and ferromagnetic material.

5. The memory cell of claim 4 wherein the anti-ferromagnetic material is IrMn, and the ferromagnetic material is NiFe.

6. The memory cell of claim 1 wherein the pinned structure extends horizontally and is magnetized in a first horizontal direction, and an axis of the free structure extends horizontally and the free structure is selectively magnetized in either a first or second circumferential direction.

7. A closed flux memory cell comprising:
a horizontally extending ferromagnetic hard layer;
a horizontally extending tube-shaped ferromagnetic structure, the tube-shaped ferromagnetic structure is located adjacent to the ferromagnetic bard layer with an insulating layer therebetween;
a conductive sense line electrically coupled to the ferromagnetic hard layer;
a conductive write line electrically coupled to the tube-shaped ferromagnetic structure and located inside the tube-shaped ferromagnetic structure; and
a conductive half-select line located inside the tube-shaped ferromagnetic structure and electrically insulated from the write line and the tube-shaped ferromagnetic structure.

8. The closed flux memory cell of claim 7 wherein the ferromagnetic hard layer comprises an anti-ferromagnetic layer and a ferromagnetic layer located adjacent to the tube-shaped ferromagnetic structure.

9. The closed flux memory cell of claim 7 wherein the tube-shaped ferromagnetic structure has a non-round shape when viewed as a vertical cross-section.

10. The closed flux memory cell of claim 7 wherein the ferromagnetic hard layer is shared with adjacent memory cells.

11. The closed flux memory cell of claim 7 wherein the ferromagnetic hard layer and the tube-shaped ferromagnetic structure comprise NiFe.

12. The closed flux memory cell of claim 7 wherein the tube-shaped ferromagnetic structure has a length up to 1000 nm, an outer diameter of up to 400 nm, and a thickness of up to 40 nm.

13. A closed flux memory cell comprising:
a horizontally extending ferromagnetic hard layer;
a horizontally extending tube-shaped ferromagnetic structure, the tube-shaped ferromagnetic structure is located adjacent to the ferromagnetic hard layer with an insulating layer therebetween;
a conductive sense line electrically coupled to the ferromagnetic hard layer;
a conductive write line electrically coupled to the tube-shaped ferromagnetic structure and located inside the tube-shaped ferromagnetic structure; and
a conductive half-select line located adjacent to the tube-shaped ferromagnetic structure and electrically insulated from the tube-shaped ferromagnetic structure.

14. The closed flux memory cell of claim 13 wherein the ferromagnetic hard layer comprises an anti-ferromagnetic layer and a ferromagnetic layer located adjacent to the tube-shaped ferromagnetic structure.

15. The closed flux memory cell of claim 13 wherein the tube-shaped ferromagnetic structure has a non-round shape when viewed as a vertical cross-section.

16. The closed flux memory cell of claim 13 wherein the ferromagnetic hard layer is shared with adjacent memory cells.

17. The closed flux memory cell of claim 13 wherein the ferromagnetic hard layer and the tube-shaped ferromagnetic structure comprise NiFe.

18. A closed flux memory cell comprising:
a horizontally extending ferromagnetic hard layer;
a horizontally extending tube-shaped ferromagnetic structure, the tube-shaped ferromagnetic structure is located adjacent to the ferromagnetic hard layer with an insulating layer therebetween;
a conductive sense line electrically coupled to the ferromagnetic hard layer;
a conductive write line electrically coupled to the tube-shaped ferromagnetic structure and located inside the tube-shaped ferromagnetic structure;
a conductive half-select line located inside the tube-shaped ferromagnetic structure and electrically insulated from the write line and the tube-shaped ferromagnetic structure; and
a hard bias magnet located adjacent the ferromagnetic hard layer.

19. A ferromagnetic memory cell comprising:
a ferromagnetic toroid having an axis extending in a horizontal direction; and
a ferromagnetic hard layer insulated from the ferromagnetic toroid, wherein data is stored by controlling a relative magnetization between the ferromagnetic toroid and the ferromagnetic hard layer.

20. The ferromagnetic memory cell of claim 19 further comprising a conductor extending through the ferromagnetic toroid in an axial direction.

21. The ferromagnetic memory cell of claim 20 wherein a magnetization of the ferromagnetic toroid is selected by applying currents through the conductor and a second conductor located proximate to, or through, the ferromagnetic toroid.

22. The ferromagnetic memory cell of claim 20 further comprises a second conductor located either proximate to, or through, the ferromagnetic toroid in the axial direction.

23. A ferromagnetic memory comprising:
a conductive row line extending in a first horizontal direction, in a plan view;
a conductive column line extending in a second horizontal direction, in the plan view;
a ferromagnetic toroid having an axis extending in the second horizontal direction, wherein the conductive column line passes through the ferromagnetic toroid;
a ferromagnetic hard layer vertically located between the conductive row line and the ferromagnetic toroid, wherein the ferromagnetic hard layer is insulated from the ferromagnetic toroid;
a conductive select line generally extending in the first horizontal direction adjacent to the ferromagnetic toroid.

24. The ferromagnetic memory of claim 23 wherein the select line passes through the ferromagnetic toroid.

25. A method of storing data in a ferromagnetic memory cell comprises establishing a relative magnetization between first and second ferromagnetic structures, wherein the first ferromagnetic structure is a toroid and its magnetization is established by controlling a sum current through first and second conductors passing through the toroid.

26. The method of claim 25 wherein a magnetization of the second ferromagnetic structure is established during fabrication.

27. The method of claim 25 wherein the first conductor is electrically insulated from the toroid.

28. A method of storing data in a ferromagnetic memory cell comprises establishing a relative magnetization between first and second ferromagnetic structures, wherein the first ferromagnetic structure is a toroid and its magnetization is established by controlling a sum current through first and second conductors, where at least the first conductor passes through the toroid.

* * * * *

UNITED STATES PATENT AND TRADEMARK OFFICE
CERTIFICATE OF CORRECTION

PATENT NO. : 6,885,576 B2　　　　　　　　　　　　　　　　　　　　　　Page 1 of 1
DATED : April 26, 2005
INVENTOR(S) : Deak, James It is certified that error appears in the above-identified patent and that said Letters Patent is hereby corrected as shown below:

Column 7,
Line 5, "located adjacent to the ferromagnetic bard layer with an" should read
-- located adjacent to the ferromagnetic hard layer with an --.

Signed and Sealed this

Twenty-first Day of March, 2006

JON W. DUDAS
*Director of the United States Patent and Trademark Office*